(12) United States Patent
Piché et al.

(10) Patent No.: US 6,868,098 B1
(45) Date of Patent: Mar. 15, 2005

(54) DUAL-WAVELENGTH PASSIVE SELF-MODULATED MODE-LOCKED SEMICONDUCTOR LASER DIODE

(75) Inventors: Michel Piché, Cap-Rouge (CA); Patrick Langlois, Ottawa (CA)

(73) Assignee: Universite Laval, Ste-Foy (CA)

( * ) Notice: Subject to any disclaimer, the term of this patent is extended or adjusted under 35 U.S.C. 154(b) by 0 days.

(21) Appl. No.: 09/504,896

(22) Filed: Feb. 16, 2000

Related U.S. Application Data

(60) Provisional application No. 60/120,127, filed on Feb. 16, 1999.

(51) Int. Cl.$^7$ ............................ H01S 3/098; H01S 3/10; H01S 3/13; H01S 5/00; H01S 3/121
(52) U.S. Cl. .............................. 372/18; 372/19; 372/23; 372/30; 372/43; 372/99; 372/107; 372/108; 372/15
(58) Field of Search .............................. 372/18, 19, 15, 372/25, 23, 30, 43, 94, 99, 107, 108, 96, 92, 98, 101, 75, 26, 46, 78.02

(56) References Cited

U.S. PATENT DOCUMENTS

| | | | | |
|---|---|---|---|---|
| 4,405,236 A | * | 9/1983 | Mitsuhashi et al. | ......... 356/459 |
| 4,635,264 A | | 1/1987 | Göbel et al. | |
| 4,835,778 A | | 5/1989 | Kafka et al. | |
| 4,896,327 A | | 1/1990 | Ebberg | |
| 4,933,947 A | * | 6/1990 | Anthon et al. | ................. 372/34 |
| 5,004,342 A | | 4/1991 | Bernard et al. | |
| 5,040,182 A | | 8/1991 | Spinelli et al. | |
| 5,079,772 A | | 1/1992 | Negus et al. | |
| 5,097,471 A | * | 3/1992 | Negus et al. | .................. 372/18 |
| 5,163,059 A | | 11/1992 | Negus et al. | |
| 5,164,954 A | | 11/1992 | Su | |
| 5,172,382 A | * | 12/1992 | Loh et al. | ...................... 372/26 |
| 5,241,555 A | | 8/1993 | Spitzer | |
| 5,349,601 A | | 9/1994 | Hohimer et al. | |
| 5,363,192 A | | 11/1994 | Diels et al. | |
| 5,383,198 A | | 1/1995 | Pelouch et al. | |
| 5,555,253 A | | 9/1996 | Dixon | |
| 5,572,542 A | | 11/1996 | Dixon | |

OTHER PUBLICATIONS

Actively Mode–locked GaInAsP Laser with Subpicosecond Output, S.W. Corzine et al., Appl. Phys. Lett., vol. 52, No. 5, Feb. 1, 1988, pp. 348–350.

Actively Mode–locked External–cavity Semiconductor Lasers with Transform–limited Single–pulse Output, Alan Mar et al., Optics Letters, vol. 17, No. 12, Jun. 15, 1992, pp. 868–870.

Non–linear Chirp Compensation in High–Power Broad–Spectrum Pulses from Single–Stripe Mode–Locked Laser Diodes, Amine Azouz et al., IEEE Journal of Selected Topics in Quantum Electronics, vol. 1, No. 2, Jun. 1995, pp. 577–582.

(List continued on next page.)

Primary Examiner—Minsun Oh Harvey
Assistant Examiner—Armando Rodriguez
(74) Attorney, Agent, or Firm—Alexandra Daoud; Ogilvy Renault

(57) ABSTRACT

Method of generating laser pulses using a semiconductor laser diode as a lasing amplification medium of an extended laser cavity are presented. Passive self-modulated mode-locked operation of the semiconductor laser diode is achieved by providing an above lasing threshold direct current input current to the semiconductor laser diode while the semiconductor laser diode is operational in a slightly misaligned extended laser cavity favoring the amplification of wavelengths shorter than a center wavelength of a continuous wave operational mode of the semiconductor laser diode at threshold.

13 Claims, 2 Drawing Sheets

OTHER PUBLICATIONS

40 GHz Active Mode–locking in a 1.5μm Monolithic Extended–cavity Laser, Electronics Letters, vol. 25, No. 10, May 11, 1989, pp. 621–622.

Picosecond Pulse Generation by Passive Mode Locking of Diode Lasers, E. P. Ippen et al., Appl. Phys. Lett. vol. 37, No. 3, Aug. 1, 1980, pp. 267–269.

Subpicosecond Pulses from Passively Mode–locked GaAs Buried Optical Guide Semiconductor Lasers, J. P. van der Ziel et al. Appl. Phys., vol. 39, No. 7, Oct. 1, 1981, pp. 525–527.

230 fs, 25 W Pulses from Conventional Mode–locked Laser Diodes with Saturable Absorber Created by Ion Implantation, Electronic Letters, vol. 29, No. 2, Jan. 21, 1993, pp. 160–162.

Passive Mode Locking of a Semiconductor Diode Laser, Y. Silverberg et al., Optics Letters, vol. 9, No. 11, Nov. 1984, pp. 507–509.

Passive Mode Locking of Buried Heterostructure Lasers with Nonuniform Current Injection, Christoph Harder et al., Appl. Phys. Lett., vol. 42, No. 9, May 1, 1983, pp. 772–774.

Subpicosecond Monolithic Colliding–pulse Mode–locked Multiple Quantum Well Lasers, Y.K. Chen et al., Appl. Phys. Lett., vol. 58, No. 12, Mar. 25, 1991, pp. 1253–1255.

Colliding Pulse Mode Locking of a Semiconductor Laser in an External Ring Cavity, Appl. Phys. Lett. vol. 62, No. 10, Mar. 8, 1993, pp. 1053–1055.

Transform–limited 1.4 ps Optical Pulses from a Monolithic Colliding–pulse Mode–locked Quantum Well Laser, M.C. Wu et al., Appl. Phys. Lett. vol. 57, No. 8, Aug. 20, 1990, pp. 759–761.

200–fs Optical Pulse Generation and Intractivity Pulse Evolution in a Hybrid Mode–locked Semiconductor Diode–laser/amplifier System, Peter J. Delfyett et al., Optics Letters, vol. 17, No. 9, May 1, 1992, pp. 670–672.

The Soliton Laser, L.F. Mollenauer et al., Optics Letters, vol. 9, No. 1, Jan. 1984, pp. 13–15.

60–fsec Pulse Generation from a Self–mode–locked Ti:sapphire Laser, D.E. Spence et al., Optics Letters, vol. 16, No. 1, Jan. 1, 1991, pp. 42–44.

Coupled–Cavity Passive Mode–Locked Injection Laser, E. M. Dianov et al., IEEE Photonics Technology Letters, vol. 3, No. 6, Jun. 1991, pp. 499–500.

Optical Pulse Generation with a Semiconductor Laser in a Coupled–Cavity Configuration, W.H. Loh et al., Pure Appl. Opt. 1, 1992, pp. 181–184.

* cited by examiner

DUAL-WAVELENGTH PASSIVE SELF-MODULATED MODE-LOCKED SEMICONDUCTOR LASER DIODE

The present application claims priority of U.S. Provisional Patent Application Ser. No. 60/120,127 filed Feb. 16, 1999.

FIELD OF THE INVENTION

The invention applies to mode-locked operation of lasers, and in particular to methods of operating a semiconductor laser diode in a passive self-modulated mode-locked regime.

BACKGROUND OF THE INVENTION

Mode-locking of semiconductor laser diodes is of interest as such sources have applications in telecommunications and in measurement systems.

Mode-locking of laser signals is used to produce trains of short pulses. Mode-locking is achieved when all modes of oscillation in a laser cavity have the same phase and when the frequency difference between neighboring oscillation modes is a constant throughout the entire emission spectrum. Under these conditions the laser signal in the time domain is defined by the coherent superposition of all oscillating, phase-locked lasing modes in the laser cavity. The main characteristics of the laser signal when mode-locking is achieved are:

i. Constructive interference of all oscillating lasing modes takes place over a short period of time, giving rise to a sharp emission spike (or a pulse). The duration of the pulse has an inverse proportional relationship with the number of oscillating lasing modes.

ii. Destructive interference between all oscillating lasing modes takes place at all other instants, producing a weak or a vanishingly small output signal. A residual level of emission in the output signal is caused by an intrinsic noise due to spontaneous emissions in the laser medium; hence the residual signal is composed of only a few photons.

iii. The laser signal is periodic, with a period defined by a duration of a round-trip wave propagation in the laser cavity.

To operate a semiconductor laser diode in the mode-locked regime, one needs to implement a modulation mechanism where the losses in the lasing medium are modulated periodically, with a period equal to the duration of a round-trip wave propagation in the laser cavity. There are general methods which are used to produce such a modulation of which: active modulation and passive modulation are but two examples. A combination these two methods has been used; under such circumstances the regime of operation is called hybrid mode-locking.

Mode-Locked Semiconductor Laser Diodes with Active Modulation

Direct modulation of the laser gain is widely used.

One method of actively modulating a semiconductor laser diode is achieved by inserting a modulator in the laser cavity associated with the semiconductor laser diode. A modulation period of the modulator is adjusted to be substantially equal to a duration of a round-trip wave propagation in the cavity or, sometimes, to a submultiple of the round-trip duration. The modulator has a 100% transmission only over a short period of time, and quenches laser signal travelling therethrough at all other instants.

In general the semiconductor laser diode is operated with an extended cavity, in order to physically accomplish the insertion of the modulator and to match the round-trip wave propagation time of the laser cavity to the modulation period of available modulators. An extended cavity is also used, in order to match the round-trip wave propagation time to the period of modulating sources available to generate the modulating electrical signals.

Another method of actively modulating a semiconductor laser diode is achieved by directly modulating the gain of the semiconductor laser diode. A coupling of a periodic electrical signal to the input of the semiconductor laser diode provides the gain necessary for laser oscillation. A period of the electrical signal applied to the laser diode is matched to the round-trip wave propagation time period in a laser cavity associated with the laser diode. As a result the gain is pulsed at a modulation period corresponding to the duration of the round-trip wave propagation in the laser cavity. Gain dynamics lead to the development of short pulses, which repeat at the modulation period.

References: S. W. Corzine, J. E. Bowers, G. Przybylek, U. Koren, B. I. Miller, and S. E. Socoolich, "Actively Mode-locked GaInAsP Laser with Subpicosecond Output", Appl. Phys. Lett. 52, 348 (1988); A. Mar, D. Derickson, R. Helkey, J. Bowers, R.-T. Huang, and D. Wolf, "Actively Mode-locked External-cavity Semiconductor Lasers with Transform-limited Single-pulse Output", Opt. Lett. 17, 868 (1992); A. Azouz, N. Stelmakh, P. Langlois, J.-M. Lourtioz, and P. Gavrilovic, "Nonlinear Chirp Compensation in High-power Broad-spectrum Pulses from Single-stripe Mode-locked Laser Diodes", IEEE J. Selected Topics in Quantum Electron. 1, 577 (1995); and R. S. Tucker, U. Koren, G. Raybon, C. A. Burrus, B. I. Miller, T. L. Koch, and G. Eisenstein, "40 GHz Active Mode Locking in a 1.5 $\mu$m Monolithic Extended-cavity Laser", Electron. Lett. 25, 621 (1989) represent developments in active modulation mode-locking techniques. A key feature of actively mode-locked operation is the possibility of synchronizing the pulses with respect to a reference electrical signal derived from the modulation signal.

Mode-Locked Semiconductor Laser Diodes with Passive Modulation

Passive modulation has been generally achieved to date using saturable absorbers. A saturable absorber has a property that its transmission is controlled by an incident laser beam. Due to the dynamics of the energy levels involved in the absorption process, transmission increases as the laser signal intensity increases. As a result, the peak of a pulse propagating therethrough undergoes a smaller absorption than the wings. The net effect is that the transmitted pulse is shortened with respect to the incident pulse. Furthermore saturable absorbers tend to quench weak signals.

Hence saturable absorbers provide a mechanism of self-modulation of the laser signal. When inserted in a laser cavity, saturable absorbers tend to restrict laser emission to short pulses. The technique is said to be passive since no external electrical or optical signal is necessary to produce the modulation.

In some cases such as presented in E. P. Ippen, D. J. Eilenberg, and R. W. Dixon, "Picosecond Pulse Generation by Passive Mode Locking of Laser Diodes", Appl. Phys. Lett. 37, 267 (1980), saturable absorption results from a progressive degradation of the lasing medium or from an optical damage (e.g. a damage induced by the circulating laser beam). Fulfilling such conditions generally leads to an irreversible damage imparted to and eventual inoperability of the laser diode.

A saturable absorber can be created by ion implantation at one facet of a laser diode, as described in J. P. Van der Ziel, W. T. Tsang, R. A Logan, R. M. Mykuliak, and W. M. Augustyniak, "Subpicosecond Pulses from Passively Mode-locked GaAs Buried Optical Guide Semiconductor Lasers", Appl. Phys. Lett. 39, 525 (1981), and N. Stelmakh and J.-M. Lourtioz, "230 fs, 25 W Pulses from Conventional Mode-locked Laser Diodes with Saturable Absorber Created by Ion Implantation", Electron. Lett. 29, 160 (1993).

Multiple quantum well structures can also be used as saturable absorbers in extended cavities, as described in Y. Silberberg, P. W. Smith, D. J. Eilenberger, D. A. B. Miller, A. C. Gossard, and W. Wiegmann, "Passive Mode Locking of a Semiconductor Laser Diode", Opt. Lett 9, 507 (1984).

Non-uniform current injection along the laser diode can also be used for passive mode-locking, as reported in C. Harder, J. S. Smith, K. Y. Lau, and A. Yariv, "Passive Mode Locking of Buried Heterostructure Lasers with Non-uniform Current Injection", Appl. Phys. Lett. 42, 772 (1983), and Y. K Chen, M. C. Wu, T. Tanbun-Ek, R. A. Logan, and M. A. Chin, "Subpicosecond Monolithic Colliding Pulse Mode-locked Multiple Quantum Well Lasers", Appl. Phys. Lett. 58, 1253 (1991).

When the latter procedure is used, the gain medium is divided in many sections, some of which are not polarized or are set in reverse biased conditions; saturable absorption takes place in sections that are not polarized or that are operated with a reverse bias.

Passive mode-locking has enabled the generation of sub-picosecond pulses, at typical average powers of around 1 mW. When a saturable absorber is placed at center of a monolithic structure as described by Y. K Chen et. al. in the publication mentioned above, or at the center of a laser diode placed in an external ring cavity as described in C. F. Un and C. L. Tang, "Colliding Pulse Mode Locking of a Semiconductor Laser in an External Ring Cavity", Appl. Phys. Lett 62, 1053 (1993), the laser diode tends to emit a pair of counterpropagating pulses which collide in the saturable absorber. Such a regime of emission is called "colliding pulse mode-locking" (CPM). CPM is generally considered to be more stable since the saturable absorption effect is enhanced by the superposition of the counterpropagating pulses.

Passive modulation has the advantage of simplicity when compared to active modulation, as the matching of the round-trip wave propagation period to an external modulation signal is not required. In general, passive mode-locking leads to shorter pulses than active mode-locking. However the pulses produced through passive mode-locking cannot be synchronized with respect to any signal.

Hybrid Mode-Locking of Semiconductor Laser Diodes

Hybrid mode-locking involves the combination of active and passive modulation. Hybrid mode-locking has been adapted to monolithic structures, such as described in M. C. Wu, Y. K. Chen, T. Tanbun-Ek, R. A. Logan, and M. A. Chin, "Transform-limited 1.4 ps Optical Pulses from a Monolithic Colliding-pulse Mode-locked Quantum Well Laser", Appl. Phys. Lett. 57, 759 (1990), or in extended cavities, such as described in P. J. Delfyett, L. Florez, N. Stoffel, T. Gmitter, N. Andreadakis, G. Alphonse, and W. Ceislik, "200-fs Optical Pulse Generation and Intracavity Pulse Evolution in a Hybrid Mode-locked Semiconductor Diode-laser/ Amplifier System", Opt. Lett. 17, 670 (1992). One can benefit from the advantages of both modulation techniques, but at the price of an added complexity.

Other Mode-Locking Methods

Solid-state lasers, such as color center and titanium-sapphire lasers, have been mode-locked through a variety of techniques that involve nonlinear phase modulation (self-phase modulation, self-focusing). Early reports on that subject can be found in L. F. Mollenauer and R. H. Stolen, "The Soliton Laser", Opt Lett. 9, 13 (1984), and D. E. Spence, P. N. Kean, and W. Sibbett, "60-fsec Pulse Generation from a Self-mode-locked Ti:sapphire Laser", Opt. Lett. 16, 42 (1991).

To date, only one method relying on nonlinear phase modulation has been successfully tested with semiconductor laser diodes: coupled-cavity mode-locking. According to the results presented in E. M. Dianov and O. G. Okhotnikov, "Coupled-cavity Passive Mode-locked Injection Laser", IEEE Photon. Technol. Lett. 3, 499 (1991), and W. H. Loh and C. F. Lin, "Optical Pulse Generation with a Semiconductor Laser in a Coupled-cavity Configuration", Pure Appl. Opt. 1, 181 (1992), coupled-cavity mode-locking has produced pulses whose duration was much longer when compared to the best results obtained with either active, passive or hybrid mode-locking.

In solid-state lasers the most efficient method of generating trains of short pulses is Kerr-lens mode-locking as described by D. E. Spence et. al. in the above mentioned publication. This method provides short stable and controllable pulses having a fast repetition rate and high peak power. Kerr-lens mode-locking relies upon self-focusing, e.g. on a lensing effect produced by the laser pulse itself when it propagates through the gain medium. Kerr-lens mode locking takes place only when the cavity geometry is set such that non-linear tensing improves round-trip laser gain or decreases round-trip losses.

In guided-wave structures such as semiconductor laser diodes, self-focusing is not effective as a mode-locking mechanism since it represents only a weak effect in comparison with the guiding effect produced by the guided-wave structure itself. This is probably why passive self-modulation mode-locking, based upon self-focusing is not operational in semiconductor laser diodes.

Therefore there is a need to develop novel methods of providing sustained passive self-modulated mode-locked operation of a semiconductor laser diode.

SUMMARY OF THE INVENTION

According to one aspect of the invention, a method of generating laser pulses using a semiconductor laser diode as a lasing amplification medium of an extended laser cavity is provided. The method includes a sequence of steps. A lasing-threshold input current is provided to the semiconductor laser diode. Elements making up the laser cavity are aligned for maximum laser output. The input current is increased beyond the lasing threshold and at least one of the elements making the laser cavity is slightly misaligned. Passive self-modulated mode-locked operation of the semiconductor laser diode is achieved.

According to another aspect of the invention, the misalignment of optical elements favor the amplification of wavelengths shorter than a center wavelength of a continuous wave operational mode of the semiconductor laser diode at threshold.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION OF THE EMBODIMENTS

A semiconductor laser diode 10 is inserted in a ring cavity 12. The laser emission undergoes a transition from a noisy multimode operational regime to a mode-locked operational regime. In the mode-locked regime, trains of counterpropagating picosecond pulses are generated. The counterpropagating pulses are temporally synchronized and are centered about different wavelengths.

Dual-wavelength emission is a novel characteristic of a passive self-modulated mode-locked semiconductor laser diode 10. The procedure used to mode-lock the semiconductor laser diode 10 includes a proper cavity alignment as a key feature.

Figure 1:
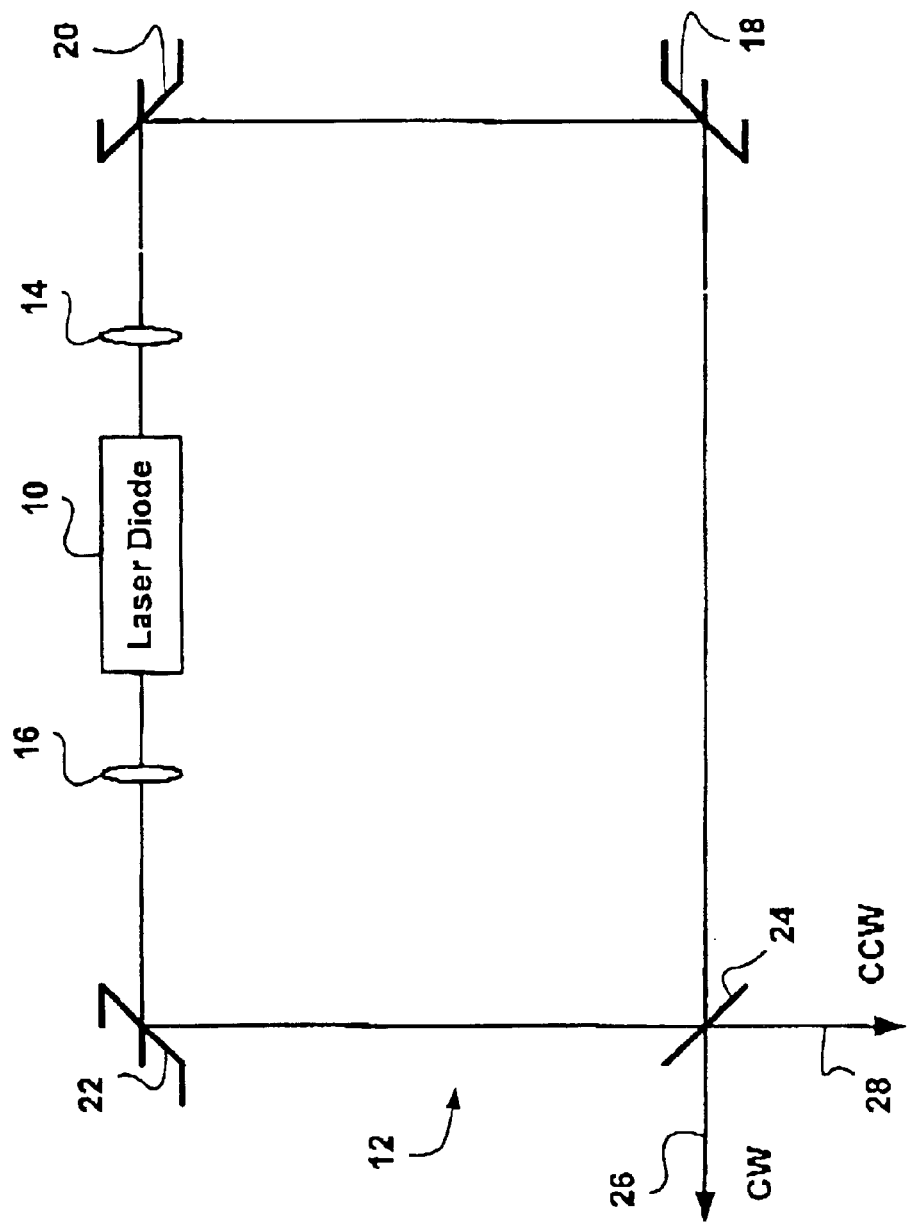
FIG. 1 is a block diagram showing an exemplary arrangement of optical elements enabling a passive self-modulated mode-locked operation of a semiconductor laser diode.

The apparatus is schematically represented in FIG. 1. The apparatus includes the following elements:

A semiconductor laser diode amplifier 10. The laser diode amplifier provides a gain necessary for lasing action. The laser diode 10 is a superluminescent diode such as a 500 micron long double quantum well InGaAs ridge waveguide with strained InGaAlAs active layers from EG&G Optoelectronics, Vaudreuil, Canada (p/n C86095E CD2209). The two end facets of the laser diode 10 are cut at a 5-degree angle (not shown). An antireflection coating is deposited on the two end facets. In the absence of the cavity, the laser diode provides a low coherence emission with a broad spectrum centered near 855 nm. The angle-stripe geometry plus the antireflection coatings effectively prohibit parasitic or self-oscillation of the laser diode 10. The two end facets of the laser diode 10 are optically accessible, hence enabling inclusion thereof in the ring cavity 12. A bias input current is provided to the laser diode 10 is purely DC enabling a continuous laser excitation.

Two aspheric lenses 14 and 16 having a large numerical aperture are used. The lenses 14 and 16 have antireflection coatings deposited on their surfaces. Similar lenses are available from Thorlabs (#C230TMB). The lenses 14 and 16 are used to collimate the laser beam that exits the semiconductor laser diode 10 at each of its angled facets.

The ring cavity 12, with three flat gold-coated mirrors 18, 20 and 22, and an output coupler 24. The output coupler 24 has an 83% power transmission.

There are two beams 26 and 28 at the output. Beam 26 is associated with waves circulating in the ring cavity 12 in a clockwise direction (designated as CW in FIG. 1). Beam 28 is associated with waves circulating in the counterclockwise direction in the ring cavity 12 (designated as CCW in FIG. 1).

Other ring cavities could be used to obtain mode-locked operation, based on the operation principles described in this document: ring cavities with a different number of flat mirrors (three mirrors, five mirrors, etc.), ring cavities with curved mirrors, ring cavities employing total internal reflection, ring cavities with prisms or other spectral filters typically used in tuning a laser, ring cavities with an external mirror used to augment the number of circulating pulses.

Procedure Used to Obtain a Self-Modulated Mode-Locked Operation

Passive self-modulation mode-locking is achieved according to the following steps:

The laser cavity is carefully aligned. Laser emission takes place when the input bias current exceeds a lasing threshold value $I_{th}$. The cavity alignment is adjusted such that the laser output power is maximized.

The DC input bias current I is adjusted to a value slightly above the lasing threshold. Typically I is set at to 1.2 $I_{th}$.

The cavity is slightly misaligned by tilting one of the cavity mirrors 18, 20 or 22, or the output coupler 24. Misalignment is done in a direction parallel to the active layer.

The method described above leads to onset of a self-modulated mode-locked emission regime. Mode-locking can reliably be sustained over periods of many hours, repeatedly. No significant degradation of the performance of the semiconductor laser diode is noticeable after hundreds of hours of operation.

Figure 2:
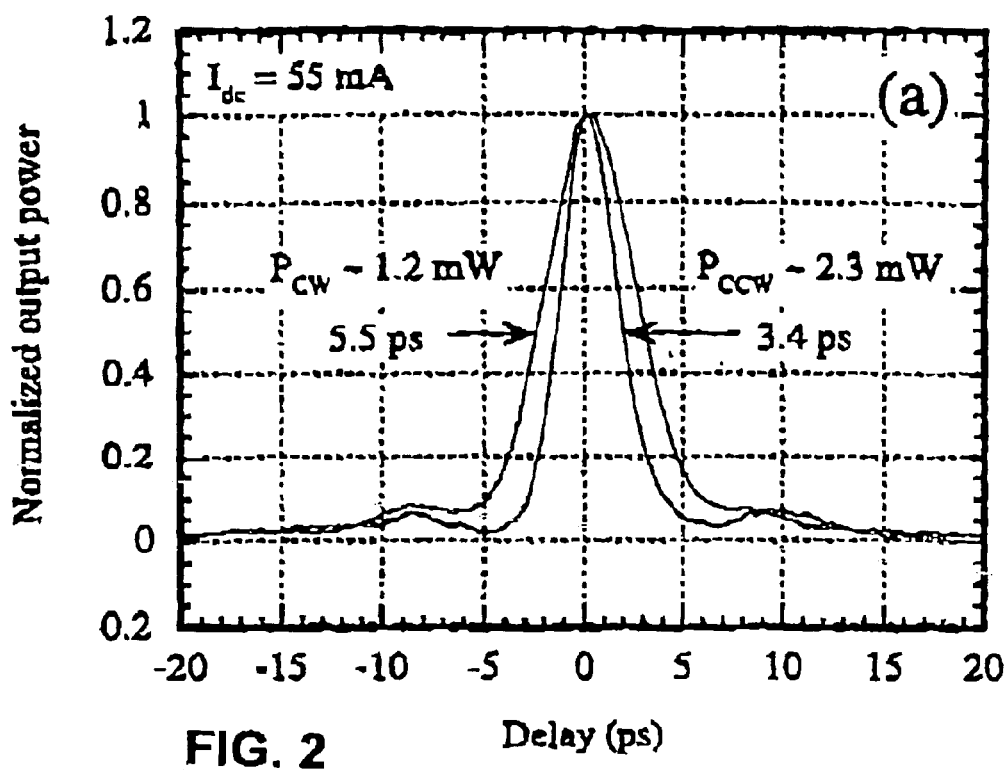
FIG. 2 is a graph showing exemplary normalized autocorrelation traces of output counterpropagating pulses when the semiconductor laser diode operates under passive self-modulated mode-locked conditions.

The characteristics of the passive self-modulated mode-locked semiconductor laser diode emission are:

Emission of synchronized picosecond pulses. Typical examples of which are shown in FIG. 2. The autocorrelation traces show that the pulse duration using the above-mentioned laser diode ranges from 2 to 6 picoseconds, but the invention shall not be limited to these values. Measurements indicate that the counterpropagating pulses are synchronized and that they collide in the active medium.

Figure 3:
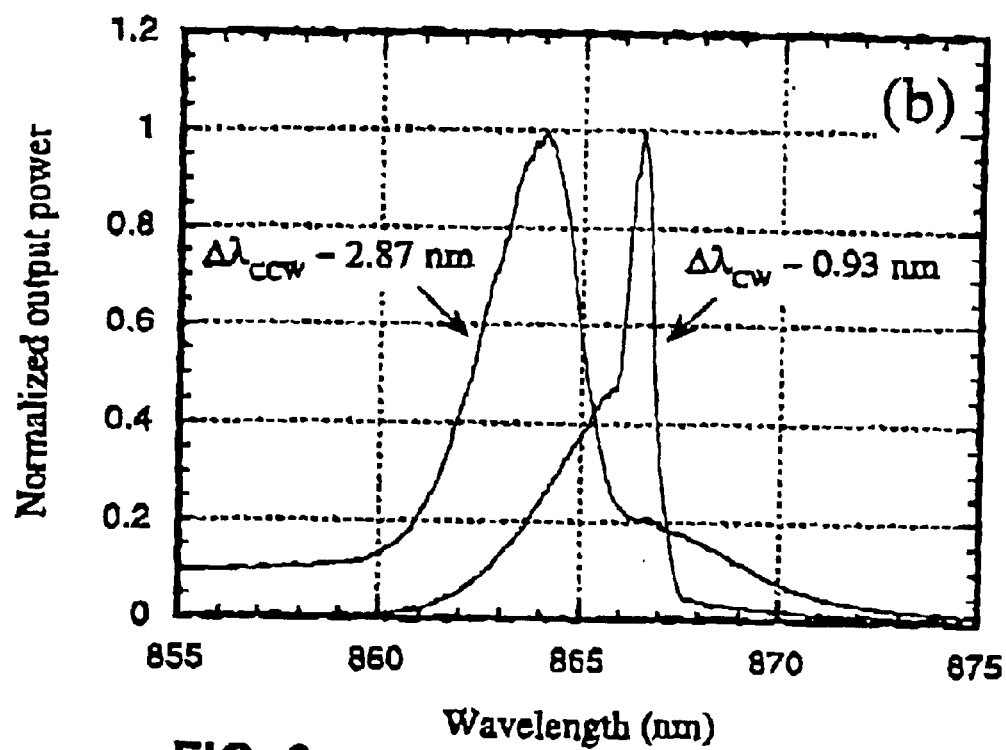
FIG. 3 is a graph showing exemplary normalized output counterpropagating pulse spectral densities when the semiconductor laser diode operates under passive self-modulated mode-locked conditions.

Dual-wavelength emission. The spectra of the counterpropagating pulses are dissimilar, as shown in FIG. 3. The pulses emitted in the CCW direction were blue-shifted with respect to the pulses generated in the CW direction. The shift could be controlled by the amount of misalignment of the laser cavity. The shift is adjustable between 1 and 7 nm, but the invention shall not be limited to these values.

Emission at high repetition rates. If the round-trip time in the cavity is in the order of 1.25 nanoseconds, the repetition rate is 800 MHz. By retroflecting a weak fraction of the laser output into the laser cavity, the repetition rate could be increased to harmonics of 800 MHz; in such situations many pulses are co-propagating along the CW and the CCW directions. Repetition rates up to 6.4 GHz have been achieved, but the invention shall not be limited to these values.

Output power. In the mode-locked regime, the average output power from either the CW beam or the CCW beam is 3 mW, but the invention shall not be limited to these values.

The key features of this type of mode-locking are the purely passive character, the reliability and the dual-wavelength emission.

Physical Mechanisms Involved in the Mode-Locking Process

It was observed that the natural emission of the semiconductor diode used in this implementation, in the absence of any laser cavity effect, was not identical as exiting from the end facets. The natural emission was more intense in the CCW direction. The CW spectrum showed quenching of the blue part of the spectrum. One plausible interpretation of the observed behavior is that the semiconductor laser diode has a defect at the output facet along the CW direction. That defect would cause attenuation leading to the different spectra observed in the natural emission. The natural emission is in fact amplified spontaneous emission.

The defect could behave as a saturable absorber, hence providing a mechanism for passive mode-locking. However measurements of a luminosity (optical power) versus-current-(LI) curve when the laser diode 10 was used in the ring cavity 12 did not show any hysteresis, which would be a consequence of saturable absorption. No evidence of saturable absorption was seen when the laser diode 10 was used to amplify a beam externally provided from another semiconductor laser diode (not shown).

The sensitivity to alignment is partly attributed to a nonlinear bending process (or self-bending). Any saturation of the gain at an input facet, or saturation of the absorption at a defect on a facet, changes the index of refraction of the guided-wave structure and hence the optimal coupling angle at the facet. Short pulses are likely to saturate the gain differently than multiple-mode unlocked signals. Hence the coupling angle in the waveguide structure of the semiconductor laser diode 10 may be different for the two regimes of emission. Misalignment of the cavity can be used to select the angle of the beam incident on the facet, hence the regime of emission.

Another physical mechanism that can contribute to the alignment sensitivity is chromatic aberration of the intercavity optical components. The chromatic aberration comes from the collimating lenses 14 and 16. By tilting a cavity mirror 18, 20 or 22, or the output coupler 24 one may change the optimal lasing wavelength. For that wavelength the coupling losses in the laser structure are minimized. If there is a high absorption by a defect at that wavelength, then the laser may fall below threshold, even though the coupling losses in the laser structure are at a minimum. By saturating the absorption in the defect, laser action can take place, and the laser emission takes the form at short pulses.

Nonlinear interactions of the counterpropagating pulses in the semiconductor laser diode 10 may contribute to broaden the pulses through wave mixing, self-phase modulation and cross-phase modulation, hence providing a better power extraction than non-mode-locked signals. That mechanism produces a better overlap of the pulse spectrum with the gain spectrum of the semiconductor laser diode 10.

The origin of the dual-wavelength emission is attributed to the fact that the defect causing attenuation is not placed at center of the gain medium, but at one end facet. As a result, one beam 28 (CCW) sees the defect before it gets amplified, while the other beam 26 (CW) passes through the defect after it has been amplified. Hence the pulses emitted along opposite directions are not equivalent, in the sense that they are subject to different dynamics. The spatial asymmetry, in combination with the dynamics of amplification, provides a mechanism through which the spectra of the counterpropagating pulses evolve differently.

Other Experimental Configurations Suitable for Mode-Locked Operation

Defects could be produced at one facet of a semiconductor laser diode amplifier by ion implantation. Dual-wavelength mode-locked emission is expected to take place if the laser diode is inserted in a ring cavity.

Semiconductor laser diode amplifiers with unbiased or reverse biased sections placed near one end facet should lead to the same type of emission, if placed in a ring cavity.

The use of other output couplers with different reflectivity has the effect of shifting the value of threshold current $I_{th}$ for laser oscillation; it has been verified that the mode-locking process still takes place slightly above threshold.

There are other options for cavity misalignment: tilting a cavity mirror along a direction perpendicular to the active medium, or a motion of a collimating lens along the propagation axis, or a combination of these mechanical adjustments.

These options have been verified to produce self-mode-locking with the apparatus shown in FIG. 1.

The methods described herein should be applicable to any semiconductor laser diode, provided the methodology described herein is followed.

The embodiments of the invention described above are intended to be exemplary only. The scope of the invention is therefore intended to be limited solely by the scope of the appended claims.

We claim:

1. A method of generating dual-wavelength laser pulses using a semiconductor laser diode as a lasing amplification medium of an extended ring-laser cavity, the method comprising the steps of:
   a) aligning elements making up the laser cavity for maximum continuous wave laser output;
   b) providing said semiconductor laser diode with at least one of a defect located near an end facet and a defect located at an end facet to provide a dual wavelength operation;
   c) providing to the semiconductor laser diode an input current beyond a lasing threshold; and
   d) setting at least one of the elements making up the laser cavity into a misaligned position to achieve passive mode-locked operation of the semiconductor laser diode.

2. A method as claimed in claim 1, wherein prior to the step of aligning the elements making up the laser cavity for maximum laser output the method further comprises the step of providing a lasing threshold input current to the semiconductor laser diode.

3. A method as claimed in claim 2, wherein the step of providing the lasing threshold input current, further comprises the step of providing a direct current input current to the semiconductor laser diode.

4. A method as claimed in claim 1, wherein the elements making up the laser cavity are optical elements and the step of aligning the optical elements of the laser cavity for maximum laser output further comprises the step of achieving maximum continuous wave laser output operation of the semiconductor laser diode slightly above the lasing threshold input current.

5. A method as claimed in claim 1, wherein the extended laser cavity includes at least one mirror and the step of misaligning at least one element further comprises misaligning the at least one mirror.

6. A method as claimed in claim 5, wherein the step of misaligning the at least one mirror further comprises the step of misaligning the at least one mirror in a plane of the lasing medium of the semiconductor laser diode.

7. A method of generating laser pulses using a semiconductor laser diode having an emission output favoring the amplification of at least one center wavelength at the lasing threshold as a lasing amplification medium of an extended laser cavity, the extended laser cavity including at least one mirror, the method comprising the steps of:

a) aligning elements making up the laser cavity for maximum laser output;

b) providing to the semiconductor laser diode an input current beyond a lasing threshold; and c) misaligning the at least one mirror of the laser cavity in a plane of the lasing medium of the semiconductor laser diode to favor amplification of wavelengths shorter than the at least one center wavelength to achieve passive mode-locked operation of the semiconductor laser diode.

8. A method as claimed in claim 1, wherein the extended laser cavity includes at least one lens and the step of misaligning at least one element further comprises misaligning the at least one lens.

9. A method as claimed in claim 8, wherein the step of misaligning the at least one lens further comprises the step of misaligning the at least one lens by shifting the lens along a direction of propagation of a laser signal within the laser cavity.

10. A method of generating laser pulses using a semiconductor laser diode having an emission output favoring the amplification of at least one center wavelength at the lasing threshold as a lasing amplification medium of an extended laser cavity, the extended laser cavity including at least one lens, the method comprising the steps of:

a) aligning elements making up the laser cavity for maximum laser output;

b) providing to the semiconductor laser diode an input current beyond a lasing threshold; and c) misaligning the at least one lens of the laser cavity by shifting the lens along a direction of propagation of a laser signal within the laser cavity to introduce color aberration in the laser cavity to favor amplification of wavelengths shorter than the at least one center wavelength to achieve passive mode-locked operation of the semiconductor laser diode.

11. A method as claimed in claim 1, wherein the extended laser cavity includes at least one output coupler and the step of misaligning at least one element further comprises misaligning the at least one output coupler.

12. A method as claimed in claim 11, wherein the step of misaligning the at least one coupler further comprises the step of misaligning the at least one output coupler in a plane of the lasing medium of the semiconductor laser diode.

13. A method of generating laser pulses using a semiconductor laser diode having an emission output favoring the amplification of at least one center wavelength at the lasing threshold as a lasing amplification medium of an extended laser cavity, the extended laser cavity including at least one output coupler, the method comprising the steps of:

a) aligning elements making up the laser cavity for maximum laser output;

b) providing to the semiconductor laser diode an input current beyond a lasing threshold; and c) misaligning the at least one output coupler of the laser cavity in a plane of the lasing medium of the semiconductor laser diode to favor amplification of wavelengths shorter than the at least one center wavelength to achieve passive mode-locked operation of the semiconductor laser diode.

* * * * *

UNITED STATES PATENT AND TRADEMARK OFFICE
CERTIFICATE OF CORRECTION

PATENT NO. : 6,868,098 B1
DATED : March 15, 2005
INVENTOR(S) : Michel Piché and Patrick Langlois It is certified that error appears in the above-identified patent and that said Letters Patent is hereby corrected as shown below:

<u>Title page,</u>
Item "[12] Pichéet al.", should read -- [12] Piché et al. --.

Signed and Sealed this

Twenty-fourth Day of May, 2005

JON W. DUDAS
*Director of the United States Patent and Trademark Office*